United States Patent
Lagler et al.

(10) Patent No.: US 10,547,490 B1
(45) Date of Patent: Jan. 28, 2020

(54) DIGITAL TRIGGERING SYSTEM AS WELL AS METHOD FOR PROCESSING DATA

(71) Applicant: Rohde & Schwarz GmbH & Co. KG, Munich (DE)

(72) Inventors: Andreas Lagler, Rosenheim (DE); Florian Ramian, Karlsfeld (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 16/054,261

(22) Filed: Aug. 3, 2018

(51) Int. Cl.
*H04L 27/38* (2006.01)

(52) U.S. Cl.
CPC ...... *H04L 27/3863* (2013.01); *H04L 27/3872* (2013.01)

(58) Field of Classification Search
CPC ............................ G01R 23/16; G01R 13/0254
USPC ........................................................ 375/340
See application file for complete search history.

(56) References Cited

U.S. PATENT DOCUMENTS

| | | |
|---|---|---|
| 7,765,086 B2 | 7/2010 | Hillman, Jr. et al. |
| 8,521,460 B2 | 8/2013 | Dobyns |
| 8,649,989 B2 | 2/2014 | Hillman, Jr. et al. |
| 2006/0133263 A1* | 6/2006 | Bernard ............. G01R 13/0254 370/210 |
| 2006/0265213 A1* | 11/2006 | Bernard ............. G01R 13/0254 704/216 |

* cited by examiner

*Primary Examiner* — Leila Malek
(74) *Attorney, Agent, or Firm* — Christensen O'Connor Johnson Kindness PLLC

(57) ABSTRACT

A digital triggering system for processing data relating to a signal received is described, with an analog-to-digital converter, an IQ data source providing IQ data, a first digital signal processor, and at least a second digital signal processor. The first digital signal processor is connected with the IQ data source via a first signal path. The second digital signal processor is connected with the IQ data source via a second signal path. The first digital signal processor has at least a first signal processing parameter. The second digital signal processor has at least a second signal processing parameter. The first signal processing parameter and the second signal processing parameter are independent from each other. The first digital signal processor generates a trigger signal based upon a characteristic of the IQ data obtained from the IQ data source. The first digital signal processor triggers the second digital signal processor via the trigger signal to acquire IQ data obtained from the IQ data source. Further, a method for processing data is described.

18 Claims, 2 Drawing Sheets

DIGITAL TRIGGERING SYSTEM AS WELL AS METHOD FOR PROCESSING DATA

FIELD OF THE DISCLOSURE

Embodiments of the present disclosure generally relate to a digital triggering system for processing data relating to a signal received. Further, embodiments of the present disclosure generally relate to a method for processing data.

BACKGROUND

In modern data processing devices, digital triggering systems are known that are assigned to In-phase and Quadrature-phase data (IQ data) of a digital signal processed which was digitized previously.

The digital triggering system generally ensures that data relating to a certain portion of a signal is only acquired if a certain trigger event occurs in the signal, for instance to acquire data surrounding an event of interest within the input signal. Typically, a trigger event corresponds to an anomalous event that occurs in the signal received with regard to a certain signal processing parameter. For instance, the trigger event may occur with regard to the frequency, amplitude, phase or any other signal processing parameter.

The triggering system typically comprises a trigger channel as well as an acquisition channel wherein the trigger channel processes the data received appropriately in order to identify the event of interest in the data processed corresponding to the trigger event. Once a trigger event is identified in the data processed, the trigger channel triggers the acquisition channel appropriately in order to acquire the respective data relating to the trigger event, for example to acquire data surrounding the trigger event.

For instance, U.S. Pat. No. 7,765,086 B2 shows a digital triggering system that comprises several different trigger generators which each correspond to a respective triggering channel. The trigger generators each receive the same data as the acquisition channel wherein the respective channels, namely the triggering channel as well as the acquisition channel, also have the same signal processing parameters which, therefore, are dependent from each other.

In fact, a trigger signal is generated once a trigger event is detected in the respective data, namely the IQ data provided by the IQ data source, with regard to a certain signal processing parameter wherein the respective data is acquired with regard to the same signal processing parameter that is used for triggering.

However, data relating to a certain signal processing parameter may be of interest that comes together with an event of interest which occurs in the data or rather the signal with regard to another signal processing parameter.

SUMMARY

Embodiments of the present disclosure provide a digital triggering system for processing data relating to a signal received, comprising:

an analog-to-digital converter for converting an analog input signal into a digital signal;

an IQ data source providing IQ data;

a first digital signal processor located downstream of the IQ data source; and at least a second digital signal processor located downstream of the IQ data source, the first digital signal processor being connected with the IQ data source via a first signal path so that the first digital signal processor obtains the IQ data provided by the IQ data source;

the second digital signal processor being connected with the IQ data source via a second signal path so that the second digital signal processor obtains the IQ data provided by the IQ data source;

the first digital signal processor having at least a first signal processing parameter and the second digital signal processor having at least a second signal processing parameter, the first signal processing parameter and the second signal processing parameter being independent from each other;

the first digital signal processor generating a trigger signal based upon a characteristic of the IQ data obtained from the IQ data source; and the first digital signal processor triggering the second digital signal processor via the trigger signal to acquire IQ data obtained from the IQ data source.

Accordingly, a digital triggering system is provided that is enabled to acquire IQ data based upon a trigger event wherein the second digital signal processor used for acquiring the IQ data has a signal processing parameter that is independent from the signal processing parameter used by the first digital signal processor for triggering. Thus, the first digital signal processor is at least used as a trigger generator. Hence, both digital signal processors are enabled to use different data portions of the IQ data provided as they are assigned to independent signal processing parameters. Therefore, a wide variety of different signal processing parameters may be used for identifying a trigger event and acquiring data since the IQ data is acquired with regard to a signal processing parameter that is independent of the signal processing parameter used for triggering.

In general, the characteristic of the IQ data may relate to a trigger event occurring in the signal which corresponds to the IQ data provided by the IQ data source.

For instance, the first digital signal processor may investigate the signal or rather the IQ data obtained in the time domain such as power over time or rather amplitude over time, whereas the second digital signal processor acquires data relating to frequency over time. Hence, frequency and time data is acquired once the first digital signal processor identifies a trigger event in the power and time data or rather amplitude and time data. Accordingly, different signal processing parameters may be applied for triggering and acquisition.

The IQ data obtained may be compared with a threshold value so as to identify an occurring trigger event. The trigger event may relate to reaching or rather exceeding the threshold value. For instance, the power or rather the amplitude of the signal is compared with the threshold value so as to provide an amplitude versus time triggering.

The signal received may be converted into a digital signal, for instance by using the analog-to-digital converter, the digital signal being demodulated so as to obtain the IQ data provided by the IQ data source. This means that the signal has been modulated previously wherein it is demodulated in order to obtain the IQ data. Thus, the IQ data source may relate to a IQ demodulation module, which can be implemented in hardware, software, or a combination of hardware and software.

According to an aspect, the first digital signal processor and the second digital signal processor have different signal processing parameters. Thus, the signal processing parameters used by the digital signal processors are not only independent from each other, but different.

The first digital signal processor and the second digital signal processor may be configured to capture the signal received on different portions of the spectrum of the signal. Therefore, a frequency focus may be applied since different frequencies or rather frequency spans are processed by the digital signal processors. In other words, the first digital signal processor may use a narrowband frequency span while investigating the signal or rather the IQ data obtained, for instance in the time domain (power over time or rather amplitude over time) whereas the second digital signal processor uses a wideband frequency span. Alternatively, the digital signal processors may relate to different frequency portions of the signal received as a filter or different filters are applied.

According to another aspect, the first digital signal processor also acquires IQ data obtained from the IQ data source. Thus, both digital signal processors are used for acquiring IQ data. Therefore, the first digital signal processor is not only used as a trigger generator. Furthermore, both digital signal processors may acquire data with regard to different portions of the spectrum of the signal.

In addition, both digital signal processors may acquire data with regard to different or at least independent signal processing parameters. Alternatively, both digital signal processors may acquire IQ data with regard to the same signal processing parameter. Hence, the first digital signal processor uses a first signal processing parameter for triggering and a second processing parameter for acquisition.

In some embodiments, the IQ data acquired by the first digital signal processor and the IQ data acquired by the second digital signal processor relate to different portions of the spectrum of the signal received. The signal received corresponds to the IQ data provided by the IQ data source since the IQ data is generated from the signal received. Therefore, the spectrum of the signal received which is digitized and demodulated may be divided into different portions wherein the digital signal processors are assigned to dedicated portions so that they process different portions of the spectrum of the signal.

Generally, a wideband frequency span as well as a narrowband frequency span of the signal received can be processed by the digital signal processors that relate to the different portions of the spectrum of the signal received. In these different portions, the independent signal processing parameters may be applied by the digital signal processors.

In some embodiments, it is not necessary that real-time capable hardware for the whole bandwidth is used in order to acquire data in a wideband signal. Thus, the costs can be reduced significantly.

Moreover, the first digital signal processor and the second digital signal processor may be connected with each other via a trigger line via which the first digital signal processor forwards the trigger signal to the second digital signal processor. Thus, the second digital signal processor may relate to a further stage with regard to the first digital signal processor as it also receives the trigger signal provided by the first digital signal processor.

According to another embodiment, the first signal path and the second signal path both branch off from a common signal path line connected to the IQ data source. Thus, both signal paths are connected with a common signal path line so that the IQ data provided by the IQ data source is forwarded to both signal paths. The IQ data provided is, however, processed differently by the digital signal processors connected thereto, for example with regard to the signal processing parameters and/or the portions of the spectrum of the signal processed by the digital signal processors.

Furthermore, the first digital signal processor may use at least one of frequency domain triggering, time domain triggering, phase domain triggering, modulation domain triggering and demodulation domain triggering, for instance frequency mask triggering, amplitude versus time triggering, frequency modulation (FM) bandwidth triggering and FM bandwidth deviation triggering. For instance, minimum, maximum, peak, roots means square, average and/or slope may be applied for triggering. In addition, Quadrature Amplitude Modulation (QAM) triggering, Code Domain Multiple Access (CDMA) triggering, and Orthogonal Frequency Division Multiplexing (OFDM) triggering may be used.

Accordingly, typical IQ based triggers can be used by the first digital signal processor in order to identify a trigger event.

Besides the IQ based triggers mentioned above, any other IQ based trigger can be used by the first digital signal processor for identifying a trigger event and to generate the trigger signal that triggers the second digital signal processor to acquire IQ data respectively.

According to another embodiment, a temporary intermediate storage for IQ data is provided that is assigned to at least one of the first digital signal processor and the second digital signal processor. In the temporary intermediate storage, IQ data is temporarily stored so that this temporarily stored data can be acquired if a trigger event occurs. This ensures that IQ data can be acquired even though the trigger event occurs later.

Furthermore, a user interface may be provided via which a user is enabled to make settings of at least one of the first digital signal processor and the second digital signal processor. For instance, the user may set an offset with regard to the acquisition of IQ data so that IQ data is acquired by an offset earlier than the trigger event occurs.

For this purpose, at least the second digital processor is assigned to the temporary intermediate storage so that the IQ data temporarily stored in the temporary intermediate storage may be acquired and forwarded to the acquisition memory.

According to an aspect, the acquisition of IQ data via the second digital signal processor can be shifted by setting an offset. This shifting of the acquisition of IQ data relates to a time shift so that the acquisition of IQ data takes place earlier or even later depending on the offset set by the user. Hence, the offset is a time offset.

For instance, the acquisition of IQ data via the second digital signal processor is started prior to a trigger event. The temporarily stored IQ data in the temporary intermediate storage is forwarded to the acquisition memory so that this data is acquired even though the trigger event occurs later. The trigger event is assigned to the characteristic of the IQ data obtained or rather the characteristic of the signal.

According to another aspect, the digital triggering system comprises a measurement module, the measurement module providing further analysis. The data obtained or rather acquired may be further analyzed by using the measurement module that is part of the digital triggering system.

For instance, the measurement module comprises the first digital signal processor at least in parts so as to generate the trigger signal. The trigger signal may be generated depending on an analysis done by the measurement module. For this purpose, the measurement module comprises the first digital signal processor at least in parts so that generating the trigger signal is controlled by the measurement module.

The measurement module may be assigned to the second signal path for further analyzing the IQ data processed by at least one of the second signal path and the second digital signal processor. Hence, the IQ data acquired by the second digital signal processor may be analyzed by the measurement module. Alternatively or additionally, the IQ data processed by the signal path may be analyzed by the measurement module.

Moreover, an acquisition memory for IQ data may be provided to store the IQ data acquired, the acquisition memory being connected with at least one of the first digital signal processor and the second digital signal processor. For instance, the acquisition memory may also be connected with the temporary intermediate storage for IQ data so that the temporarily stored IQ data may be forwarded to the acquisition memory for acquiring purposes so that the respective data may be acquired depending on an offset set by the user.

Generally, the acquisition memory being connected with both digital signal processors ensures that the IQ data acquired by both signals processors can be stored for further processing.

Furthermore, the at least one second digital signal processor corresponds to a stage of the digital triggering system, wherein the digital triggering system may have several stages which receive the trigger signal from the first digital signal processor. In other words, the digital triggering system may comprise several digital signal processors established like the second digital signal processor so that the first digital signal processor triggers the several digital signal processors each using signal processing parameters being different to the one used by the first digital signal processor for triggering.

Generally, a signal processing device may be provided that comprises the digital triggering system as described above.

Hence, the signal processing device comprises the analog-to-digital converter, the IQ data source, the digital signal processors, the respective signal paths and/or lines, the temporary intermediate storage for IQ data, the user interface, the measurement module and/or the acquisition memory for IQ data.

Embodiments of the present disclosure also provide a method for processing data, comprising the following steps:
converting an analog signal into a digital signal;
obtaining IQ data from the digital signal;
processing the IQ data obtained while a first signal processing parameter is taken into account by a first digital signal processor;
generating a trigger signal via the first digital signal processor when a trigger event occurs in the IQ data processed with regard to the first signal processing parameter; and
acquiring IQ data via a second digital signal processor which takes a second signal processing parameter into account that is independent from the first signal processing parameter.

As already discussed, both digital signal processors use signal processing parameters which are independent from each other so that the acquired data is independent from the data used for triggering.

The signal received may be captured on different portions of the spectrum of the signal by the digital signal processors. For instance, a frequency filter or a frequency sport may be applied.

Moreover, IQ data may be acquired by both digital signal processors. Hence, the first digital signal processor is assigned to a triggering channel and an acquisition channel simultaneously.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
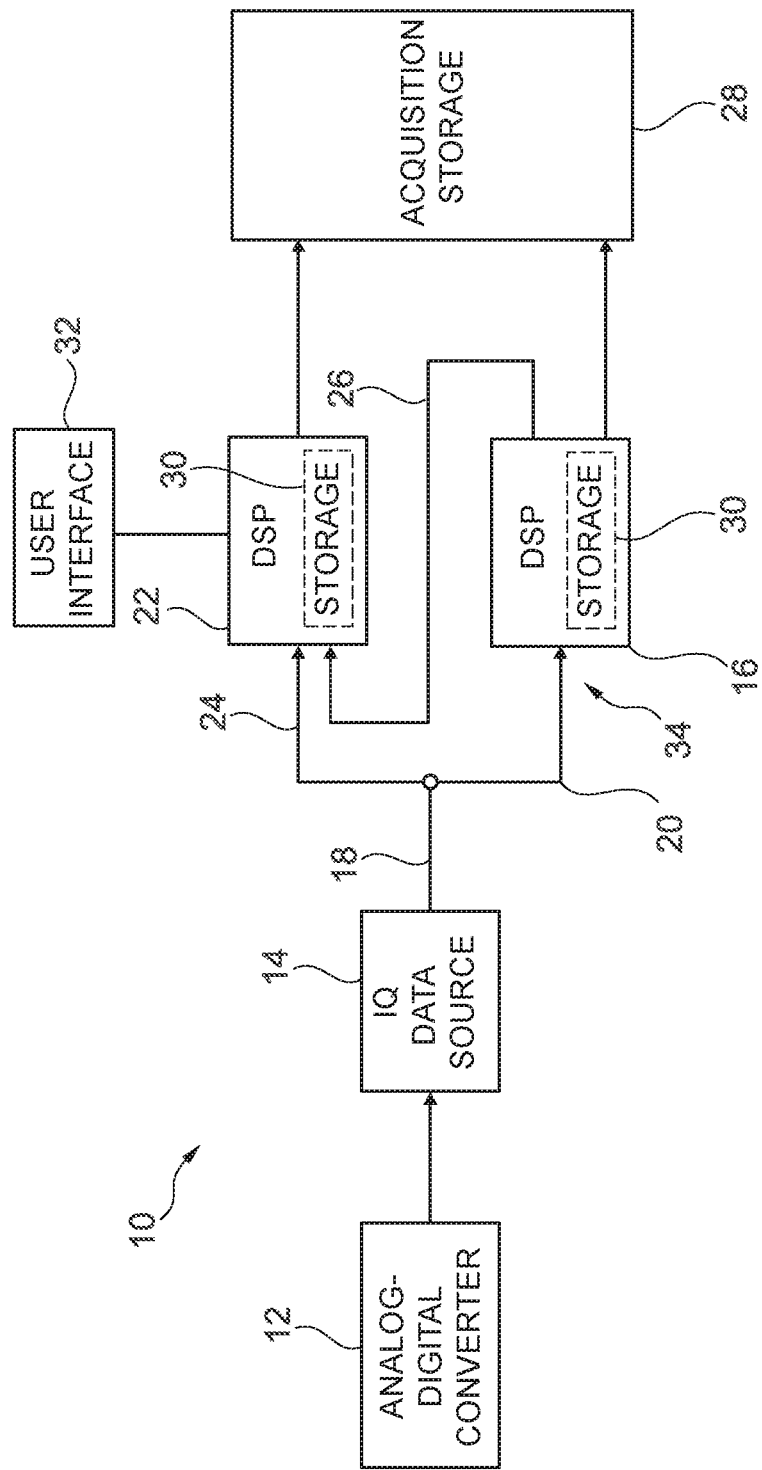
FIG. 1 schematically shows a digital triggering system according to an embodiment of the present disclosure.

In FIG. 1, a digital triggering system 10 is shown that may be part of a signal processing device such as a measurement device and/or a signal analysis device. The digital triggering system 10 comprises an analog-to-digital converter 12 that converts an analog signal received via an input into a digital signal. For instance, a radio frequency (RF) signal is converted into a digital signal. The analog-to-digital converter 12 is connected with an IQ data source 14 that provides IQ data by processing the digitized signal received from the analog-to-digital converter 12. In some embodiments, the digital signal received may be demodulated so that an IQ demodulation module may be the IQ data source 14 providing the IQ data. Such demodulation can be carried out in software or hardware or a combination of hardware and software.

The digital triggering system 10 or rather the signal processing device having the digital triggering system 10 may comprise a radio frequency (RF) signal conditioner, a local oscillator for converting the RF signal into an intermediate frequency (IF) signal by mixing with a local oscillator frequency as well as a filter for filtering the IF signal obtained. The respective units may be located upstream of the analog-to-digital converter 12 so that the pre-processed IF signal is digitized.

Downstream of the analog-to-digital converter 12, the digital triggering system 10 or rather the data processing device having the digital triggering system 10 may have a signal correction unit for correcting the amplitude and phase data of the digitized IF signal. The corrected and digitized IF signal is then processed or rather demodulated so as to generate a set of I (In-phase) data and Q (Quadrature-phase) data, namely the IQ data, that is provided by the IQ data source 14 for further processing.

As shown in FIG. 1, the IQ data source 14 is connected to a first digital signal processor 16 via a common signal path line 18 and a first signal path 20. Further, the IQ data source 14 is connected with a second digital signal processor 22 via the common signal path line 18 and a second signal path 24. Thus, the first signal path 20 and the second signal path 24 both are connected with the IQ data source 14 via the common signal path line 18. In other words, the first signal path 20 as well as the second signal path 24 both branch off from the common signal path line 18 being directly connected to the IQ data source 14. This ensures that both digital signal processors 16, 22 receive the same IQ data corresponding to the signal received that has been digitized previously.

The functionality of the first and/or second digital signal processors 16, 22 herein described can be implemented in software, such as a DSP engine, or hardware, or a combination of hardware and software. In one embodiment, the first and/or second digital signal processors 16, 22 comprise a programmed DSP chip or microprocessor.

Both digital signal processors 16, 22 have signal processing parameters being independent from each other so that the first digital signal processor 16 has a first signal processing parameter whereas the second digital signal processor 22 has a second signal processing parameter. The signal processing parameters are independent from each other. In other words, both digital signal processors 16, 22 are configured to apply signal processing parameters being independent from each other so that the signal received, for example the IQ data obtained from the signal, may be investigated in many ways. In some embodiments, the signal processing parameters used by both signal processors 16, 22 can be different from each other.

Furthermore, the first digital signal processor 16 is connected with the second digital signal processor 22 via a trigger line 26 so that acquisition of IQ data via the second digital signal processor 22 can be triggered via a trigger signal generated by the first digital signal processor 16 as will be described hereinafter.

Since both digital signal processors 16, 22 use independent signal processing parameters, the first digital signal processor 16 may apply a certain trigger with regard to the first signal processing parameter once a dedicated characteristic (trigger event) occurs so as to generate the trigger signal based upon the characteristic or rather the trigger event. The trigger signal generated is forwarded to the second digital signal processor 22 via the trigger line 26 to trigger acquisition of IQ data obtained from the IQ data source 14 via the second digital signal processor 22 with regard to the second signal processing parameter.

Generally, the first digital signal processor 16 investigates the IQ data forwarded by the IQ data source 14 so as to find a trigger event or rather a characteristic in the IQ data received while using the first signal processing parameter whereas the second digital signal processor 22 acquires IQ data while using the second signal processing parameter being independent from the first one.

In addition, both digital signal processors 16, 22 may correspond to different frequency spans of the spectrum of the analog signal converted previously so that the different signal processing parameters are applied to different signal portions of the spectrum of the signal processed, for instance to a wideband signal portion and a narrowband signal portion. Accordingly, a frequency filter or rather a frequency spot may be applied (simultaneously).

For this purpose, the digital signal processors 16, 22 may have respective filters so that the digital signal processors 16, 22 are configured to capture the signal received on different portions with regard to the frequency.

Thus, high IQ bandwidth can be processed by the digital triggering system 10 easily without the need of having real-time capable hardware for the whole bandwidth. The costs for the digital triggering system 10 as well as the signal processing device having the digital triggering system 10 can be reduced significantly.

Furthermore, the digital triggering system 10 comprises an acquisition memory 28 that is assigned to both digital signal processors 16, 22 so that both digital signal processors 16, 22 may acquire IQ data that can be stored in the acquisition memory 28. The IQ data acquired by the first digital signal processor 16 as well as the IQ data acquired by the second digital signal processor 22 may relate to different portions of the spectrum of the analog signal received wherein these different portions correspond to the IQ data provided by the IQ data source.

Moreover, a temporary intermediate storage 30 for IQ data may be provided that is assigned to the second digital signal processor 22 so that IQ data can be stored temporarily in the temporary intermediate storage 30. The temporary intermediate storage 30 may also be assigned to the first digital signal processor 16 so that IQ data may also be temporarily stored in the intermediate storage 30 for IQ data wherein the respective IQ data relates to IQ data processed by the first digital signal processor 16.

The digital triggering system 10 in some embodiments may also comprise a user interface 32 via which a user may be enabled to make settings such as inputting an offset for IQ data acquisition. This ensures that IQ data acquisition can be postponed or generally shifted in time so that IQ data may be acquired prior to the occurrence of a trigger event detected by the first digital signal processor 16.

Therefore, IQ data temporarily stored in the temporary intermediate storage 30 is forwarded to the acquisition storage 28 so that the respective IQ data is acquired even though the data was obtained or rather captured prior to the trigger event used for generating the trigger signal used by the second digital signal processor 22.

In some embodiments, the digital triggering system 10 may have a measurement module 34 for further analyzing the signal received. In some embodiments, the measurement module 34 comprises the first digital signal processor 16 at least in parts so that the trigger signal is controlled by the measurement module 34. In other words, the measurement module 34 may analyze the IQ data obtained and processed by the first digital signal processor 16 so that the trigger signal is generated based on a control signal outputted by the measurement module 34.

Alternatively or additionally, the measurement module 34 in some embodiments is assigned to the second signal path 24 and/or the second digital signal processor 22 so that the respective IQ data processed by the second signal path 24 and/or the second digital signal processor 22 is used for further analyzing purposes by the measurement module 34.

In some embodiments, the digital signal processors 16, 22 may relate to narrowband frequency spans as well as wideband frequency spans so that the triggering performed in real-time corresponds to a narrowband signal portion whereas acquisition of a wideband signal portion is triggered appropriately.

Therefore, a digital triggering system 10 is provided that ensures processing high IQ bandwidth at low costs since real-time capable hardware for the whole bandwidth of the IQ data processed is not required due to the fact that both digital signal processors 16, 22 are configured to capture the signal received on different portions of the spectrum of the signal.

In addition, the digital signal processors 16, 22 have signal processing parameters being independent from each other.

Generally, the second digital signal processor 22 may correspond to an acquisition channel whereas the first digital signal processor 16 corresponds to a trigger channel and an acquisition channel simultaneously since the first digital signal processor 16 is also used to acquire IQ data.

Figure 2:
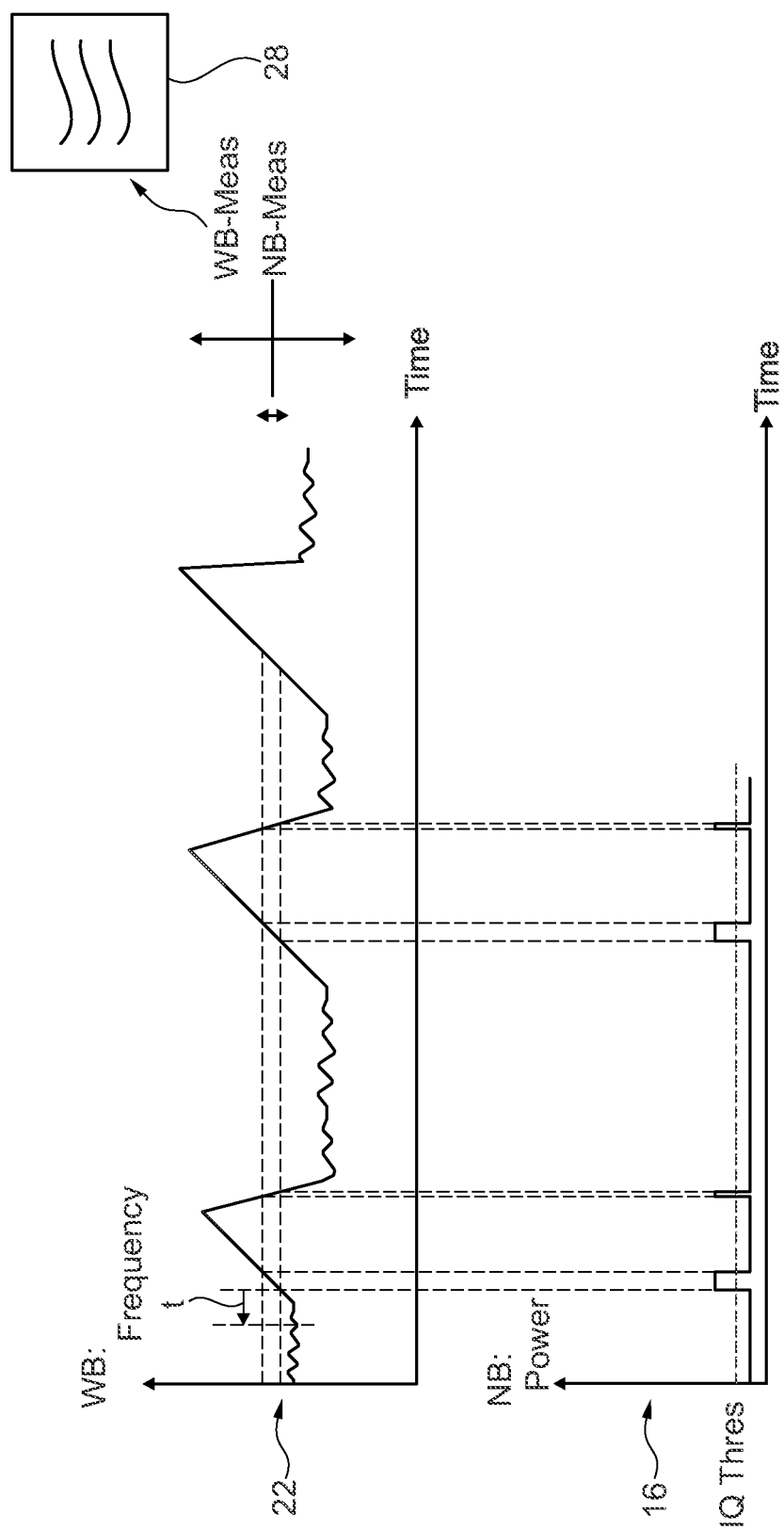
FIG. 2 schematically shows a time chart of IQ data processed by both digital signal processors.

In FIG. 2, a time chart of IQ data processed by both digital signal processors 16, 22 is shown. The lower graph illustrates the signal processing of the first digital signal processor 16 investigating the signal or rather the IQ data obtained in power over time or rather amplitude over time whereas the upper graph illustrates the signal processing of the second digital signal processor 22 investigating the signal or rather the IQ data obtained in frequency over time (spectrogram). Hence, different signal processing parameters are used by both digital signal processors 16, 22.

In some embodiments, the first digital signal processor 16 is configured to capture the signal received in a narrowband (NB) frequency span of the spectrum of the signal received whereas the second digital signal processor 22 is configured to capture the signal received in a wideband (WB) frequency span of the spectrum of the signal received.

Once the first digital signal processor 16 detects a characteristic of the IQ data obtained from the IQ data source 14, namely exceeding a pre-defined threshold value in the example shown, a trigger signal is generated for triggering the second digital signal processor 22 to acquire data with regard to the respective signal processing parameter and the respective frequency span, namely the wideband (WB) frequency span as shown in FIG. 2.

In addition, the graphs illustrate that the acquisition can be shifted in time by making certain settings as the acquisition of IQ data via the second digital signal processor 22 is started prior to a trigger event by the time t. The respective setting can be done via the user interface 32.

In addition, the overview of FIG. 2 illustrates that both digital signal processors 16, 22 acquire measurement data, namely IQ data, that is forwarded to the acquisition memory 28.

The IQ data acquired by both digital signal processors 16, 22 may be done with regard to the same signal processing parameter so that the signal processing parameter used for generating the trigger signal may be independent with regard to the signal processing parameter used by the second digital signal processor for IQ data acquisition.

Alternatively to the shown trigger, the digital triggering system 10, for example the first digital signal processor 16, may use at least one of frequency domain triggering, time domain triggering, phase domain triggering, modulation domain triggering and demodulation domain triggering.

Thus, a typical IQ based trigger can be used by the first digital signal processor in order to identify a trigger event.

Generally, any other IQ based trigger can be used by the first digital signal processor 16 for identifying a trigger event and to generate the trigger signal that triggers the second digital signal processor 22 to acquire IQ data respectively.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A digital triggering system for processing data relating to a signal received, comprising:
  an analog-to-digital converter for converting an analog input signal into a digital signal;
  an In-phase and Quadrature-phase (IQ) data source providing IQ data;
  a first digital signal processor located downstream of said IQ data source; and
  at least a second digital signal processor located downstream of said IQ data source,
  said first digital signal processor being connected with said IQ data source via a first signal path so that said first digital signal processor obtains the IQ data provided by said IQ data source;
  said second digital signal processor being connected with said IQ data source via a second signal path so that said second digital signal processor obtains the IQ data provided by said IQ data source;
  said first digital signal processor having at least a first signal processing parameter and said second digital signal processor having at least a second signal processing parameter such that both digital signal processors are enabled to use different data portions of the IQ data provided, wherein said different data portions of the IQ data relate to different frequencies of the signal received, said first signal processing parameter and said second signal processing parameter being independent from each other;
  said first digital signal processor generating a trigger signal based upon a characteristic of the IQ data obtained from said IQ data source; and
  said first digital signal processor triggering said second digital signal processor via said trigger signal to acquire IQ data obtained from said IQ data source.

2. The digital triggering system of claim 1, wherein said first digital signal processor and said second digital signal processor have different signal processing parameters.

3. The digital triggering system of claim 1, wherein said first digital signal processor and said second digital signal processor are configured to capture the signal received on different portions of the spectrum of the signal.

4. The digital triggering system of claim 1, wherein said first digital signal processor also acquires IQ data obtained from said IQ data source.

5. The digital triggering system of claim 4, wherein said IQ data acquired by said first digital signal processor and said IQ data acquired by said second digital signal processor include said different data portions of the IQ data of said signal received.

6. The digital triggering system of claim 1, wherein said first digital signal processor and said second digital signal processor are connected with each other via a trigger line via which said first digital signal processor forwards said trigger signal to said second digital signal processor.

7. The digital triggering system of claim 1, wherein said first signal path and said second signal path both branch off from a common signal path line connected to said IQ data source.

8. The digital triggering system of claim 1, wherein said first digital signal processor uses at least one of frequency domain triggering, time domain triggering, phase domain triggering, modulation domain triggering and demodulation domain triggering.

9. The digital triggering system of claim 1, wherein a temporary intermediate storage for IQ data is provided that is assigned to at least one of said first digital signal processor or said second digital signal processor.

10. The digital triggering system of claim 1, wherein a user interface is provided via which a user is enabled to make settings of at least one of said first digital signal processor or said second digital signal processor.

11. The digital triggering system of claim 1, wherein the acquisition of IQ data via said second digital signal processor can be shifted by setting an offset.

12. The digital triggering system of claim 1, wherein the acquisition of IQ data via said second digital signal processor is started prior to a trigger event.

13. The digital triggering system of claim 1, wherein said digital triggering system comprises a measurement module, said measurement module providing further analysis.

14. The digital triggering system of claim 13, wherein said measurement module is assigned to said second signal path for further analyzing the IQ data processed by at least one of said second signal path or said second digital signal processor.

15. The digital triggering system of claim 1, wherein an acquisition memory for IQ data is provided to store the IQ data acquired, said acquisition memory being connected with at least one of said first digital signal processor or said second digital signal processor.

16. The digital triggering system of claim 1, wherein the at least one second digital signal processor corresponds to a stage of the digital triggering system, the digital triggering system comprising several stages which receive said trigger signal from said first digital signal processor.

17. A method for processing data, comprising:
converting an analog signal into a digital signal;
obtaining In-phase and Quadrature-phase (IQ) data from said digital signal;
processing the IQ data obtained while a first signal processing parameter is taken into account by a first digital signal processor;
generating a trigger signal via said first digital signal processor when a trigger event occurs in the IQ data processed with regard to said first signal processing parameter; and
acquiring IQ data via a second digital signal processor which takes a second signal processing parameter into account that is independent from said first signal processing parameter such that both digital signal processors are enabled to use different data portions of the IQ data provided, wherein said different data portions of the IQ data relate to different frequencies of the signal received.

18. A digital triggering system for processing data relating to a signal received, comprising:
an analog-to-digital converter for converting an analog input signal into a digital signal;
an In-phase and Quadrature-phase (IQ) data source providing IQ data;
a first digital signal processor located downstream of said IQ data source; and
at least a second digital signal processor located downstream of said IQ data source,
said first digital signal processor being connected with said IQ data source via a first signal path so that said first digital signal processor obtains the IQ data provided by said IQ data source;
said second digital signal processor being connected with said IQ data source via a second signal path so that said second digital signal processor obtains the IQ data provided by said IQ data source;
said first digital signal processor having at least a first signal processing parameter and said second digital signal processor having at least a second signal processing parameter, said first signal processing parameter and said second signal processing parameter being independent from each other;
said first digital signal processor generating a trigger signal based upon a characteristic of the IQ data obtained from said IQ data source;
said first digital signal processor triggering said second digital signal processor via said trigger signal to acquire IQ data obtained from said IQ data source; and
said first digital signal processor and said second digital signal processor are configured to capture the signal received on different portions of the spectrum of the signal.

* * * * *